(12) United States Patent
Gerstenhaber et al.

(10) Patent No.: US 8,536,923 B2
(45) Date of Patent: Sep. 17, 2013

(54) INTEGRATOR DISTORTION CORRECTION CIRCUIT

(75) Inventors: Moshe Gerstenhaber, Newton, MA (US); Sandro Herrera, Medford, MA (US); Chau Cuong Tran, Malden, MA (US)

(73) Assignee: Analog Devices, Inc., Norwood, MA (US)

( * ) Notice: Subject to any disclaimer, the term of this patent is extended or adjusted under 35 U.S.C. 154(b) by 116 days.

(21) Appl. No.: 13/188,426

(22) Filed: Jul. 21, 2011

(65) Prior Publication Data

US 2013/0021098 A1 Jan. 24, 2013

(51) Int. Cl.
*H03L 5/00* (2006.01)
(52) U.S. Cl.
USPC ............................... 327/307; 327/317; 330/9
(58) Field of Classification Search
USPC ....................................... 327/307, 317; 330/9
See application file for complete search history.

(56) References Cited

U.S. PATENT DOCUMENTS 5,166,637 A * 11/1992 Wurcer .......................... 330/257
2003/0231060 A1 12/2003 Tam et al.

OTHER PUBLICATIONS

Analog Devices Inc., "Precision, Selectable Gain, Fully Differential Funnel Amplifier," AD8475 Datasheet, Rev. B, Apr. 2001.

* cited by examiner

*Primary Examiner* — Kenneth B. Wells
(74) *Attorney, Agent, or Firm* — Kenyon & Kenyon LLP

(57) ABSTRACT

A system and method for reducing gain error and distortion in an operational amplifier due to errors in the second or integrator stage. A correction circuit may replicate an error current and insert the current into the signal stream to preempt the induction of an error at the amplifier's input. A capacitor may sample the error voltage at the input of the integrator stage of the amplifier and generate a replica of the error current in the integration capacitor to feed it into the input of the integrator stage. This eliminates any nonlinearity errors created by error currents in the compensation or integration capacitor at the second or integrator stage of the two-stage amplifier. Feeding the error current to the integrator stage may be facilitated with a unity gain buffer and a current mirror.

17 Claims, 7 Drawing Sheets

INTEGRATOR DISTORTION CORRECTION CIRCUIT

BACKGROUND

Aspects of the present invention relate generally to the field of electronic signal processing and more specifically to reducing gain and distortion errors with a correction circuit.

In an exemplary two-stage high performance op-amp, the op-amp's input stage receives a differential voltage at a pair of inputs and generates an output current. The output current is then passed to a second stage. The second stage conventionally receives the first stage output current and a fixed reference voltage at a pair of inputs. The second stage integrates the input stage output current into compensation or integration capacitor, absorbs the input stage current at its output and produces an output voltage. A finite voltage arises at the input of the second stage due to the stage's finite trans conductance. This voltage at the second stage's input generates an error current in the integration capacitor. The generated error current creates an error voltage at the input terminals of the amplifier's first stage that is then amplified to the amplifier's output.

Such voltage error may manifest as gain error and distortion in the amplifier's output which may result in perceptible errors in the data being amplified. Conventionally, this distortion is minimal and was ignored or later compensated for in favor of small and efficient amplifiers. However, high performance circuits are increasingly sensitive to small errors. Accordingly, there is a need in the art to reduce distortion at the output of a two-stage differential amplifier.

BRIEF DESCRIPTION OF THE DRAWINGS

The foregoing and other aspects of various embodiments of the present invention will be apparent through examination of the following detailed description thereof in conjunction with the accompanying drawing figures in which similar reference numbers are used to indicate functionally similar elements.

DETAILED DESCRIPTION

Embodiments of the present invention provide a system and method for reducing gain error and distortion in an operational amplifier due to errors in the second or integrator stage. Such embodiments may include a correction circuit to replicate an error current and insert the current into the signal stream to preempt the induction of an error at the amplifier's input. Further embodiments may include a capacitor to sample the error voltage at the input of the integrator stage of the amplifier and generate a replica of the error current in the integration capacitor to feed it into the input of the integrator stage. This eliminates any nonlinearity errors created by error currents in the compensation or integration capacitor at the second or integrator stage of the two-stage amplifier. According to an embodiment, feeding the error current to the integrator stage may be facilitated with a unity gain buffer and a current mirror.

Figure 1:
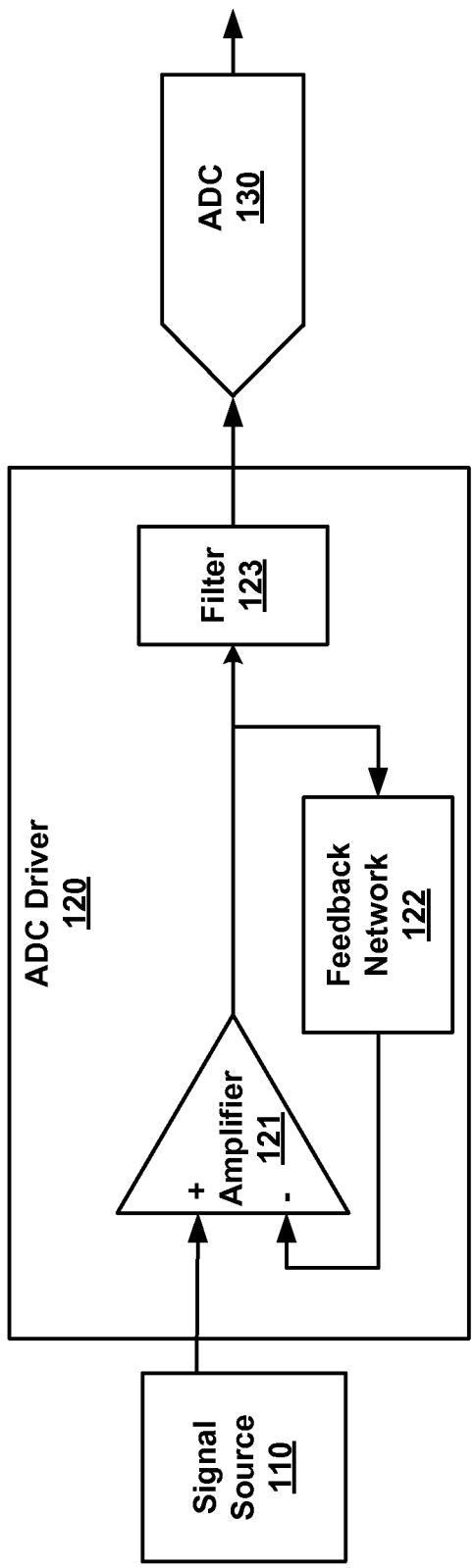
FIG. 1 is a simplified block diagram illustrating components of an exemplary system implementing an amplifier according to an embodiment of the present invention.

FIG. 1 is a simplified block diagram illustrating components of an exemplary system 100 that includes an amplifier according to an embodiment of the present invention. As shown in FIG. 1, an exemplary system may include a signal source 110, an ADC driver 120 and an ADC 130. The source 110 may be any differential signal source or single ended signal source, for example, an analog sensor or another amplifier. The ADC driver 120 may include an amplifier 121, a feedback network 122 and an anti-aliasing filter 123. The analog-to-digital converter (ADC) 130 may be a high speed ADC or precision ADC. The amplifier 121 receives the input signal from the signal source 110 and multiplies it by a constant gain set by a feedback network 122. A correction circuit in the amplifier 121 may detect and counteract a nonlinearity error within the amplifier 121, thereby reducing distortion in the amplifier output. Then the amplifier 121 outputs the amplified differential to the ADC 130. The ADC 130 then converts the analog signal into a digital signal.

As shown, the operational amplifier 121 receives a differential input and outputs a single ended signal. As will be obvious to one skilled in the art, the operational amplifier 121 may additionally receive a differential input and output a differential signal with a pair of outputs, receive a single ended input and output a single ended signal, or receive a single ended input and output a differential signal.

The amplifier 120 and the correction circuit may be implemented together as a single common integrated circuit or as separate individual components as part of a larger circuit. Additionally, in accordance with an aspect of the invention, amplifier 120 may be implemented in other circuits. For example, although in FIG. 1 the amplifier 120 is shown as a stand-alone part, the amplifier 120 may additionally be implemented as part of a line driver, a differential instrumentation amplifier, a single-ended-to-differential converter, or a differential-to-single-ended converter. Furthermore, although the amplifier and correction circuit are shown as part of an ADC driver system, the system is exemplary only and not to be viewed as limiting. As will be apparent to those skilled in the art, the correction circuit may be implemented with any amplifier application.

Figure 2:
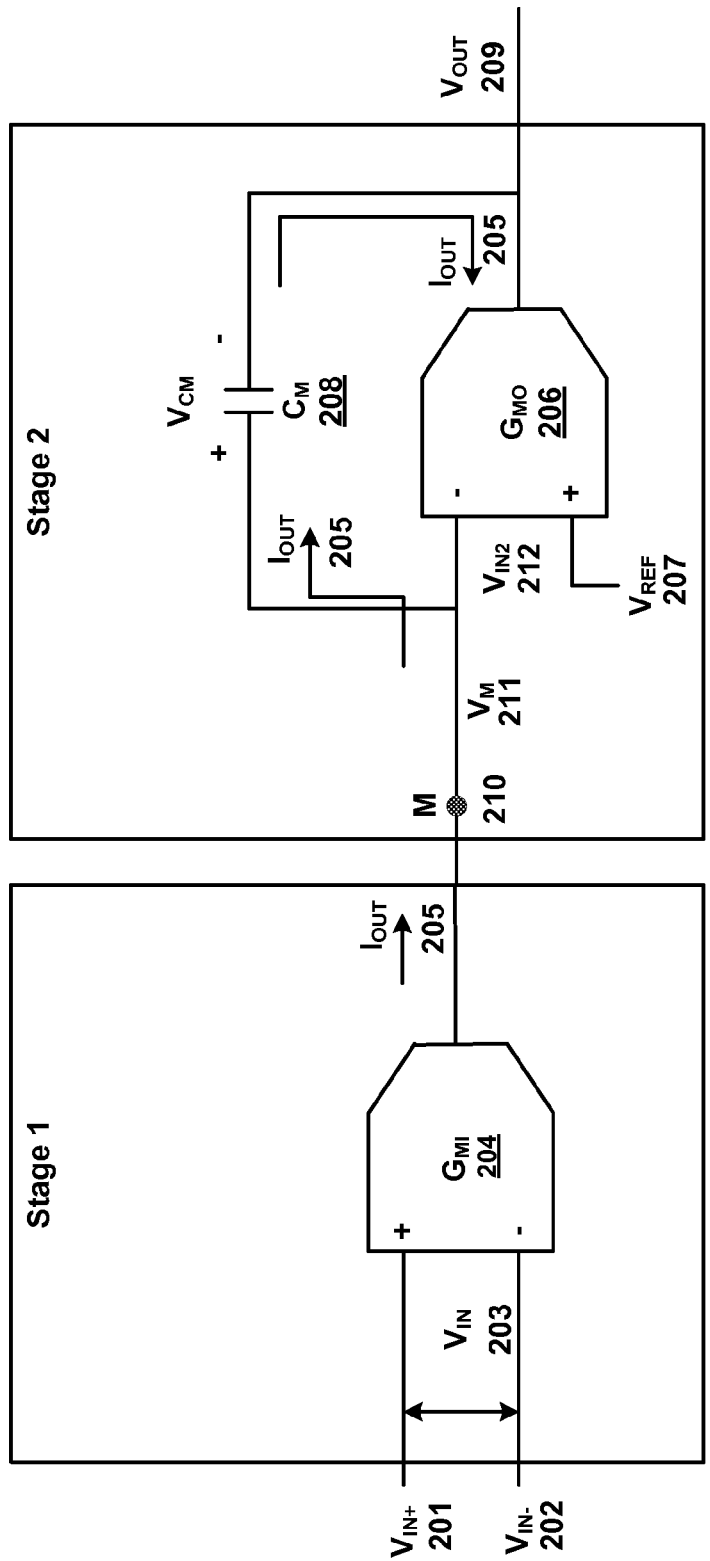
FIG. 2 illustrates a simplified circuit diagram for a conventional two-stage operational amplifier.

FIG. 2 illustrates a simplified circuit diagram for a conventional two-stage operational amplifier 200. As shown in FIG. 2, a conventional two-stage operational amplifier 200 may include a first transconductance unit 204 as a first stage of the two-stage amplifier 200 and a second transconductance unit 206 as a second stage of the two-stage amplifier 200. The first transconductance unit 204 receives two inputs, $V_{IN+}$ 201 and $V_{IN-}$ 202 and outputs current $I_{OUT}$ 205. The difference between $V_{IN+}$ 201 and $V_{IN-}$ 202 is also known as $V_{IN}$ 203. The transconductance at transconductance units 204 and 206 may be expressed as the ratio of the current change at the output port to the voltage change at the input port in accordance with Equation 1.

$$g_m = \frac{\Delta I_{OUT}}{\Delta V_{IN}} \qquad \text{EQ. 1}$$

The second stage of the two-stage amplifier, also known as the integrator stage, receives at the stage's input, node M 210, the output current $I_{OUT}$ 205 and a reference voltage $V_{REF}$ 207. The output current $I_{OUT}$ 205 is integrated by the second transconductance unit 206 into a compensation or integration capacitor $C_M$ 208 to produce an output voltage $V_{OUT}$ 209. The expected $V_{OUT}$ 209 may be calculated in accordance with Equation 2.

$$V_{OUT} = V_{REF} - V_{CM} \qquad \text{EQ. 2}$$

Since current $I_{OUT}$ 205 flows on both plates of $C_M$, the output of the second stage has to absorb this current. Due the finite transconductance of the second transconductance unit 206, a voltage $V_{IN2}$ 212 is generated, where such voltage is the voltage difference of $V_M$ 211 and $V_{REF}$ 207.

Figure 3:
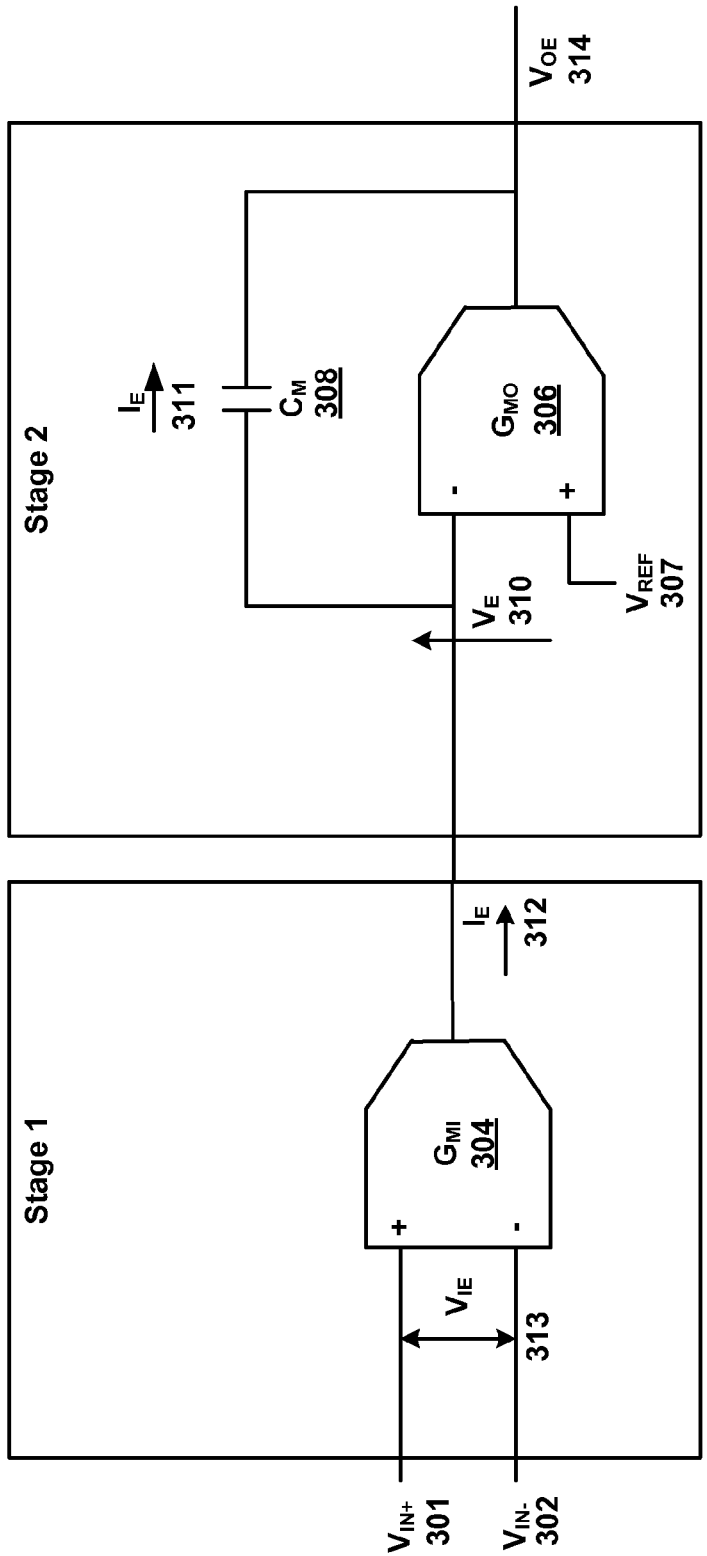
FIG. 3 illustrates a simplified circuit diagram for a conventional two-stage operational amplifier.

FIG. 3 illustrates a simplified circuit diagram for a conventional two-stage operational amplifier 300. As shown in FIG. 3, error voltages and error currents are generated within the two-stage amplifier 300. To sink or source any current at the output of the second stage of the two-stage amplifier 300, a finite differential input voltage is required at the inputs of the second stage. This is due to the finite transconductance of the second transconductance unit 306. This differential input voltage is an error voltage $V_E$ 310. Furthermore, any nonlinearity in the transconductance of the second transconductance unit 306 will cause error voltage $V_E$ 310 to contain nonlinear components or distortion. Then, the error voltage $V_E$ 310 will induce an error current $I_E$ 311 into capacitor $C_M$. The error current $I_E$ 311 is supplied by the first transconductance unit 304 as an input error current $I_E$ 312. The input error current $I_E$ 312 subsequently generates an input error voltage $V_{IE}$ 313 at the input of the first stage, between $V_{IN+}$ 301 and $V_{IN-}$ 302. The input error voltage $V_{IE}$ 313 is subsequently amplified to the output of the amplifier 300 as an output error voltage $V_{OE}$ 314. If $V_{OE}$ 314 is a linear voltage, the amplifier 300 will exhibit a gain error. If $V_{OE}$ 314 is non-linear, the amplifier 300 will exhibit distortion. In almost all embodiments of a two stage operational amplifier 300, $V_{OE}$ 314 is non-linear and the amplifier 300 will exhibit distortion.

Figure 4:
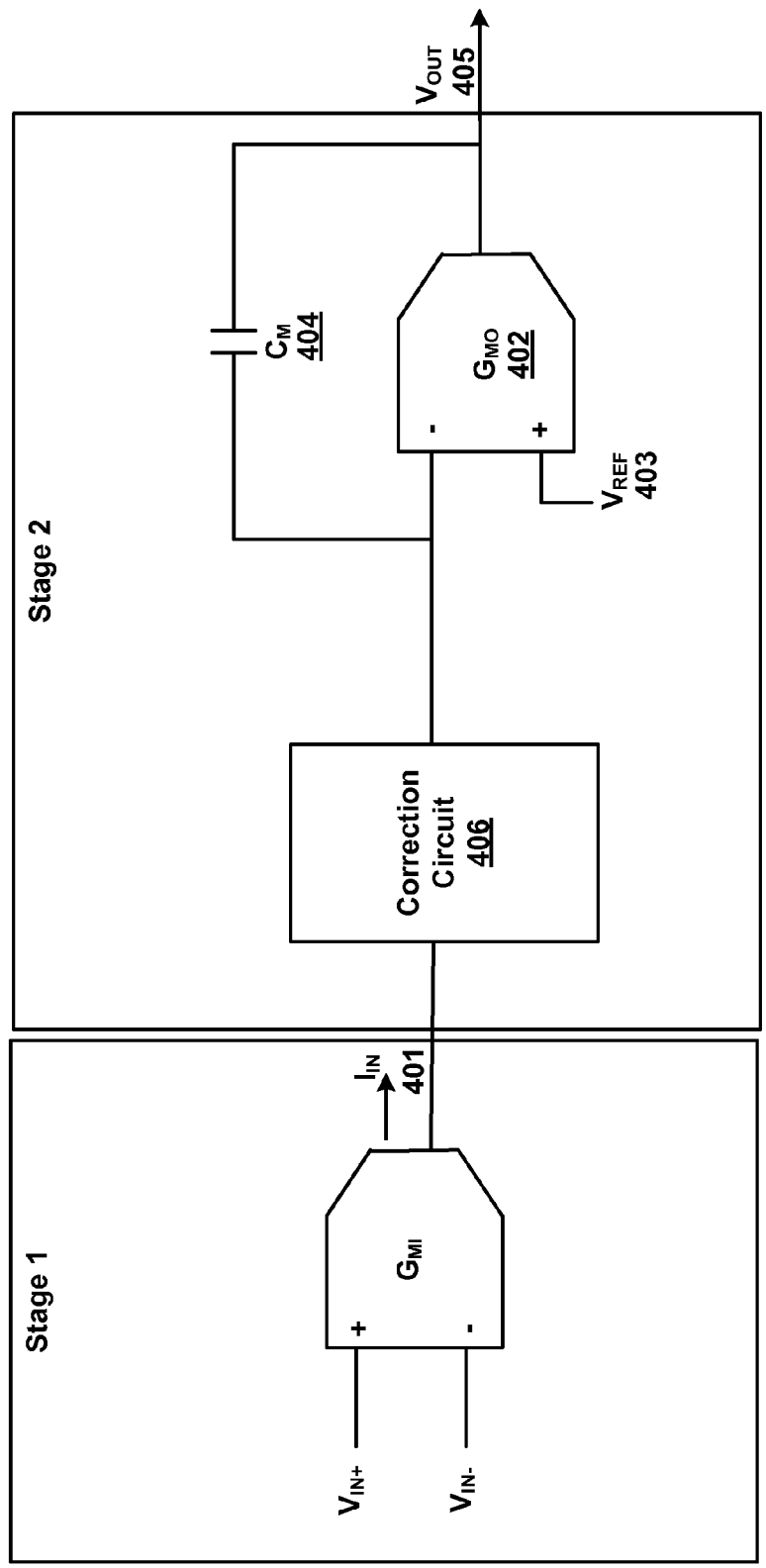
FIG. 4 illustrates a simplified circuit diagram for an exemplary two-stage operational amplifier according to an embodiment of the present invention.

FIG. 4 illustrates a simplified circuit diagram for a two-stage operational amplifier 400 according to an embodiment of the present invention. As shown in FIG. 4, the two-stage amplifier 400 includes a correction circuit 406 to correct for the anticipated $V_E$ and $I_E$. With the replica $I_E$ generated by the correction circuit 406, a corresponding $I_E$ need not be created by the first stage of the amplifier and will not generate $V_{IE}$. Consequently, the input error voltage will not be generated by the first stage and will not be amplified to the output of the amplifier 400.

As shown in FIG. 4, the first stage of the two-stage amplifier 400 is unchanged from the first stage of a conventional two-stage amplifier. The second stage of the two-stage amplifier 400 shown in FIG. 4 may include a transconductance unit 402 and a compensation capacitor $C_M$ 404. Additionally, the second stage may receive an input current $I_{IN}$ 401 from the first stage of the amplifier. Correction circuit 406 may replicate the error current induced at the compensation capacitor $C_M$ 404, and mirror the replicated error current to the input of the second stage transconductance unit 402.

The compensation unit may be designed to accommodate the anticipated $V_E$ and $I_E$ and include components to accurately sample and mirror the error current back into the transconductance unit 402. In accordance with another embodiment, the correction circuit 406 may include a controller to detect a voltage error $V_E$ at the input terminals of the transconductance unit 402, or a current error $I_E$ at the compensation capacitor $C_M$ 404. Then the controller may set the components in the correction circuit 406 to accurately sample and channel the error current to the transconductance unit 402.

Figure 5:
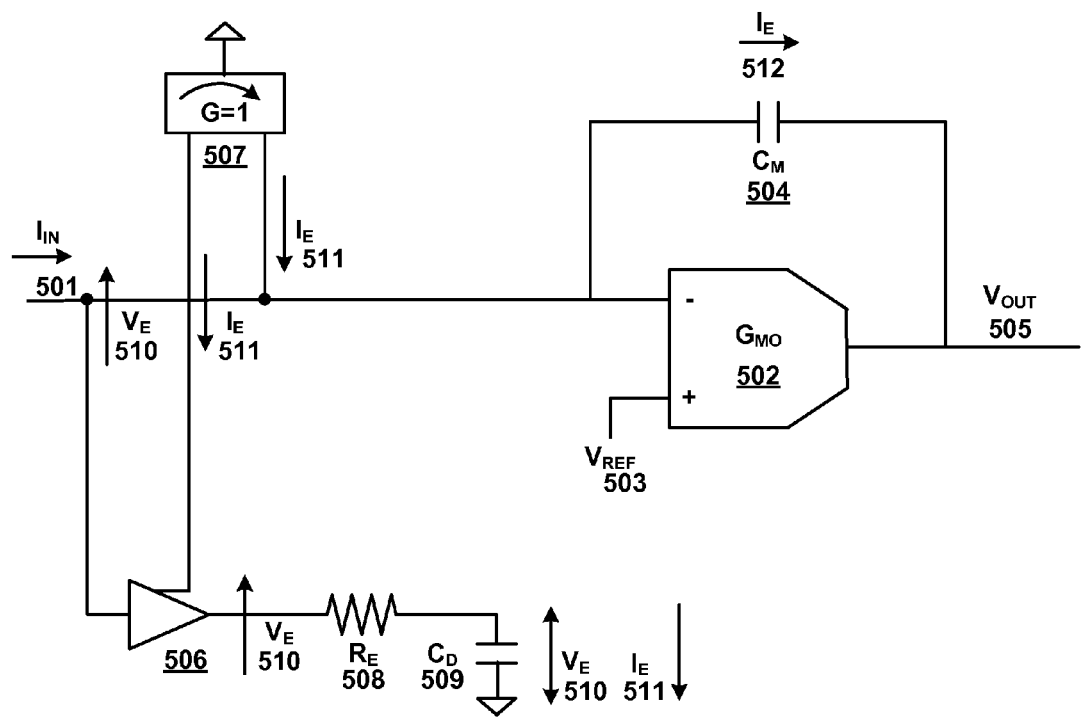
FIG. 5 illustrates a simplified circuit diagram of a correction circuit and a second stage in an exemplary two-stage operational amplifier according to an embodiment of the present invention.

FIG. 5 illustrates a simplified circuit diagram for a second stage of a two-stage operational amplifier 500 according to an embodiment of the present invention. The second stage of the two-stage amplifier 500 may include a transconductance unit 502, a compensation capacitor $C_M$ 504 and may additionally include a correction circuit including a unity gain voltage buffer 506, a current mirror 507, a resistor 508 and a capacitor 509.

As shown in FIG. 5, error voltages and error currents may be generated within the second stage of the amplifier 500 in response to current $I_{IN}$ 501. The unity gain voltage buffer 506 may sample the error voltage $V_E$ 510 and apply it to capacitor 509. If capacitor 509 has the same value as compensation capacitor $C_M$ 504, the error voltage $V_E$ 510 and error current $I_E$ 511 induced at capacitor 509 may be the same as the error current $I_E$ 512 induced at compensation capacitor $C_M$ 504. The replicated error current $I_E$ 511 may then be input into the second stage transconductance unit 502 with the current mirror 507 without generating an error current or error voltage at the first stage of the two-stage amplifier.

Assuming an ideal unity gain voltage buffer 506 in FIG. 5, the transfer function of the second stage of the amplifier 500 shown in FIG. 5 may be calculated in accordance with Equation 3 where 's' denotes complex frequency.

$$\frac{V_O}{I_{IN}} = \frac{s \frac{1}{G_{MO}} C_M - 1}{s C_M} \cdot \frac{s R_E C_D + 1}{s \left( R_E - \frac{1}{G_{MO}} \right) C_D + 1} \qquad \text{EQ. 3}$$

Note that if RE is smaller than $1/G_{MO}$, the circuit will be unstable. Thus, the second stage of the amplifier 500 may additionally include a resistor $R_E$ 508 to stabilize the positive feedback loop and avoid unwanted oscillations. Also, note that at the frequency range of interest, before the frequency of the zero and pole in the second term, the circuit behaves like an ordinary integrator with a $1/sC_M$ roll-off and a right half plane zero.

In an implementation of an exemplary embodiment, low distortion was achieved. For example, in Table 1, the second level harmonic distortion (HD2) and third level harmonic distortion (HD3) levels as detected at the output of an amplifier built in accordance with the embodiment disclosed in FIG. 5 are compared to the harmonic distortion level detected at the output of a conventional amplifier.

TABLE 1

|  | Frequency | | | | | |
|---|---|---|---|---|---|---|
|  | 10 KHz | | 100 KHz | | 200 KHz | |
|  | HD2 | HD3 | HD2 | HD3 | HD2 | HD3 |
| Distortion at Amplifier with Correction | −119 dB | −135 | −88 | −97 | −77 | −83 |
| Distortion at Conventional Amplifier | −101 dB | −109 | −80 | −76 | −72 | −63 |

Figure 6:
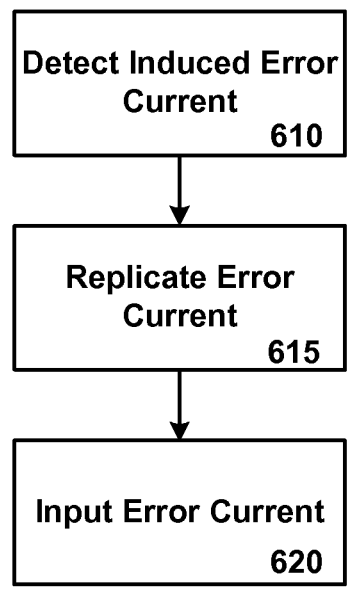
FIG. 6 is a simplified flow diagram illustrating general operation of an embodiment of a method of countering the distortion in a differential amplifier.

FIG. 6 illustrates an exemplary method 600 to limit distortion in an amplifier in accordance with the current invention. As shown in FIG. 6, a correction circuit may be implemented to eliminate the resultant distortion at the output of an amplifier if an induced error current is detected in the integration capacitor of the amplifier's second stage unit due to the finite transconductance of the transconductance unit (block 610). If an error current is detected, the detected error current may be replicated (block 615). Replication of the detected error current may include generating a duplicate current using similar components to those components generating the error current or any known method for error current replication. Once the error current is replicated, the error current may be input into the transconductance unit to cancel the previously detected error current (block 620).

Figure 7:
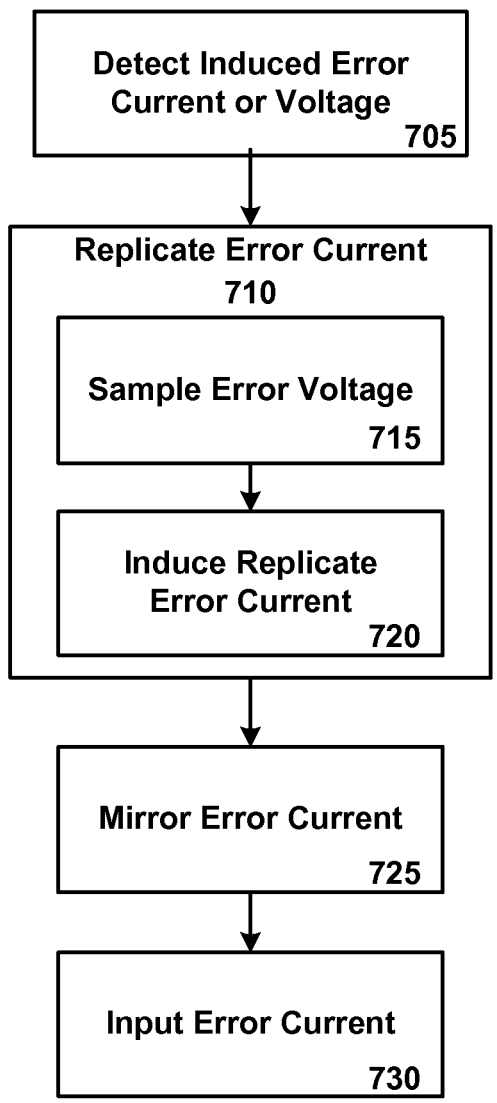
FIG. 7 is a simplified flow diagram illustrating general operation of an embodiment of a method of countering the distortion in a two stage operational amplifier.

FIG. 7 illustrates an exemplary method 700 to limit distortion in an amplifier in accordance with the current invention. As shown in FIG. 7, a correction circuit may be implemented if an induced error current or error voltage created by the finite transconductance of the transconductance unit is detected to eliminate the resultant distortion at the output of an amplifier (block 705). An error voltage may be detected across the inputs to the transconductance unit. An error current may be detected in the compensation or integration capacitor. If an error is detected, the error current may be replicated (block 710). As shown in FIG. 7, replication of the detected error current may include sampling the error voltage (block 715) and inducing a replicate error current (block 720). Sampling may include, for example, buffering the error voltage with a unity gain voltage buffer. The buffered error voltage may then be applied to a correction capacitor to induce a current. If the correction capacitor has the same value as the compensation capacitor, the induced current may be equivalent to the detected error current. Once the error current is replicated, the error current may be mirrored (block 725) and input into the transconductance unit to cancel the error current in the compensation capacitor (block 730).

The embodiments disclosed herein illustrate the inventive circuit as part of an operational amplifier; however, the circuit may effectively be implemented to lower distortion levels in other products including but not limited to differential amplifiers, difference amplifiers, power amplifiers, variable gain amplifiers and instrumentation amplifiers. Further, it is noted that the arrangement of the blocks in FIGS. 6-7 does not necessarily imply a particular order or sequence of events, nor is it intended to exclude other possibilities.

The foregoing discussion identifies functional blocks that may be used in signal processing systems constructed according to various embodiments of the present invention. In practice, these systems may be applied in a variety of devices, such as mobile devices provided with integrated video cameras (e.g., camera-enabled phones, entertainment systems and computers) and/or wired communication systems such as videoconferencing equipment and camera-enabled desktop computers. In some applications, the functional blocks described hereinabove may be provided as elements of an integrated software system, in which the blocks may be provided as separate elements of a computer program. In other applications, the functional blocks may be provided as discrete circuit components of a processing system, such as functional units within a digital signal processor or application-specific integrated circuit. Still other applications of the present invention may be embodied as a hybrid system of dedicated hardware and software components. Moreover, the functional blocks described herein need not be provided as separate units. Such implementation details are immaterial to the operation of the present invention unless otherwise noted above.

While the invention has been described in detail above with reference to some embodiments, variations within the scope and spirit of the invention will be apparent to those of ordinary skill in the art. Thus, the invention should be considered as limited only by the scope of the appended claims.

What is claimed is:

1. A system comprising:
an operational amplifier having an input transconductance stage driving an integrator stage; and
a correction circuit to cancel an error current in a compensation capacitor created by an error voltage at an input of the integrator stage of the amplifier and to channel a correction current to the compensation capacitor.

2. The system of claim 1, wherein the correction circuit comprises a unity gain buffer, a correction capacitor, and a current mirror.

3. The system of claim 2, wherein the correction circuit further comprises a resistor.

4. The system of claim 2, wherein the value of the compensation capacitor equals the value of the correction capacitor.

5. The system of claim 2, wherein the unity gain buffer replicates the error voltage at the input of the integrator stage, a current output of the unity gain buffer is input into the current mirror, and an output current of the current mirror is input into the integrator stage of the amplifier.

6. The system of claim 2, wherein an output of the unity gain buffer is coupled to the correction capacitor.

7. The system of claim 3, wherein the resistor is coupled to an output of the unity gain buffer and to the correction capacitor.

8. The system of claim 1, wherein the operational amplifier and the correction circuit are provided in a common integrated circuit.

9. A method comprising:
detecting an error voltage at an input of an integrator unit;
replicating an error current created by the error voltage; and
channeling the replicated current to the input of the integrator unit.

10. The method of claim 9, wherein the integrator unit comprises:
a transconductance unit; and
an integration capacitor connected across an input of the transconductance unit and an output of the transconductance unit.

11. The method of claim 9, wherein said replicating further comprises:
sampling an error voltage at the input of the integrator unit; and
inducing the replicated current with the sampled error voltage.

12. The method of claim 11, wherein said inducing includes applying the error voltage to a capacitor.

13. The method of claim 12, wherein said inducing further comprises setting a value of the capacitor to replicate the error current.

14. The method of claim 11, wherein said sampling includes buffering the error voltage with a unity voltage buffer.

15. The method of claim 9, wherein said channeling further comprises mirroring the replicated current to an input of the integrator unit.

16. A method of amplifying a differential signal comprising:
generating an output current with a received input voltage at an input transconductance stage of an operational amplifier;

generating a correction current based on an input voltage of an integrator stage of the operational amplifier; and integrating the output current and the correction current at the integrator a stage of the operational amplifier to generate an output voltage.

17. The method of claim 16, wherein said generating a correction current comprises:

sampling an error voltage at input terminals of the integrator stage;

generating an error current with the error voltage; and channeling the error current to an input of the integrator stage.

* * * * *

UNITED STATES PATENT AND TRADEMARK OFFICE
CERTIFICATE OF CORRECTION

| | | |
|---|---|---|
| PATENT NO. | : 8,536,923 B2 | Page 1 of 1 |
| APPLICATION NO. | : 13/188426 | |
| DATED | : September 17, 2013 | |
| INVENTOR(S) | : Gerstenhaber et al. | |

It is certified that error appears in the above-identified patent and that said Letters Patent is hereby corrected as shown below:

In the claims,

In column 7, line 4, change "the integrator a stage" to --the integrator stage--

Signed and Sealed this
Twenty-ninth Day of September, 2015

Michelle K. Lee
*Director of the United States Patent and Trademark Office*